United States Patent
Ramalingam et al.

(10) Patent No.: US 8,895,365 B2
(45) Date of Patent: Nov. 25, 2014

(54) TECHNIQUES AND CONFIGURATIONS FOR SURFACE TREATMENT OF AN INTEGRATED CIRCUIT SUBSTRATE

(75) Inventors: Suriyakala Ramalingam, Chandler, AZ (US); Rajen S. Sidhu, Chandler, AZ (US); Nisha Ananthakrishnan, Chandler, AZ (US); Sivakumar Nagarajan, Chandler, AZ (US); Wei Tan, Chandler, AZ (US); Sandeep Razdan, Chandler, AZ (US); Vipul V. Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 13/601,788

(22) Filed: Aug. 31, 2012

(65) Prior Publication Data

US 2014/0061902 A1   Mar. 6, 2014

(51) Int. Cl.
*H01L 21/00* (2006.01)

(52) U.S. Cl.
USPC .............................. 438/118; 427/256; 29/841

(58) Field of Classification Search
CPC ........... H01L 2224/32225; H01L 2224/48227; H01L 2224/73265; H01L 2924/15311; H01L 24/12
USPC .................. 427/256, 284, 314; 438/118, 121; 29/121, 841, 855
See application file for complete search history.

(56) References Cited

U.S. PATENT DOCUMENTS

| | | | | |
|---|---|---|---|---|
| 6,323,295 | B1 * | 11/2001 | Muhlebach et al. | 526/171 |
| 2002/0028533 | A1 * | 3/2002 | Tang et al. | 438/106 |
| 2010/0109150 | A1 * | 5/2010 | Caruana et al. | 257/693 |
| 2011/0147912 | A1 * | 6/2011 | Karpur et al. | 257/687 |
| 2011/0169033 | A1 * | 7/2011 | Fukunaga et al. | 257/98 |
| 2012/0164791 | A1 * | 6/2012 | Kim et al. | 438/118 |

* cited by examiner

*Primary Examiner* — Shaun Campbell
(74) *Attorney, Agent, or Firm* — Schwabe, Williamson & Wyatt, P.C.

(57) ABSTRACT

Embodiments of the present disclosure are directed towards techniques and configurations for surface treatment of an integrated circuit (IC) substrate. In one embodiment, an apparatus includes an integrated circuit substrate, an interconnect structure disposed on the integrated circuit substrate, the interconnect structure being configured to route electrical signals to or from the integrated circuit substrate and comprising a metal surface, and a protective layer disposed on the metal surface of the interconnect structure, the protective layer comprising a first functional group bonded with the metal surface and a second functional group bonded with the first functional group, wherein the second functional group is hydrophobic to inhibit contamination of the metal surface by hydrophilic materials and further inhibits oxidation of the metal surface. Other embodiments may be described and/or claimed.

10 Claims, 5 Drawing Sheets

TECHNIQUES AND CONFIGURATIONS FOR SURFACE TREATMENT OF AN INTEGRATED CIRCUIT SUBSTRATE

FIELD

Embodiments of the present disclosure generally relate to the field of integrated circuits, and more particularly, to techniques and configurations for surface treatment of an integrated circuit substrate.

BACKGROUND

An integrated circuit (IC) package assembly may include one or more dies coupled with a package substrate using interconnect structures such as, for example, bond pads or solderable materials. Contamination of the interconnect structures may lead to failure of the IC package assembly. For example, an underfill material bleed or other contaminant in the assembly process can come into contact with the interconnect structures and adversely affect the reliability or electrical performance of solder joints or other connections formed by the interconnect structures. Additionally, interconnect structures may be susceptible to oxidation, which may have similar adverse effects to electrical performance or joint reliability.

Currently, underfill materials may be deposited between a die and a package substrate to encapsulate interconnect structures between the die and the package substrate. Keeping the underfill material within a designated area on the package substrate called "Keep Out Zone" has become more challenging as dies and package substrates scale to smaller sizes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
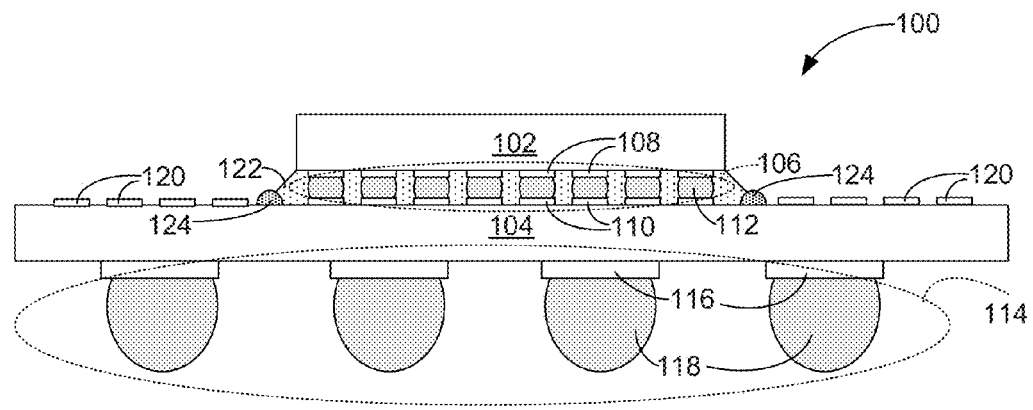
FIG. 1 schematically illustrates an example integrated circuit (IC) package assembly, in accordance with some embodiments.

Embodiments of the present disclosure describe techniques and configurations for surface treatment of an integrated circuit (IC) substrate. In some embodiments, the surface treatment may include formation of a protective layer on metal surfaces of an IC substrate to inhibit contamination and/or oxidation. In some embodiments, the surface treatment may include formation of an underfill barrier on an IC substrate to control flow of an underfill material. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates an example integrated circuit (IC) package assembly 100, in accordance with some embodiments. The IC package assembly 100 may include one or more dies (hereinafter "die 102") coupled with a package substrate 104 using one or more die interconnect structures (hereinafter "interconnect structures 106").

In some embodiments, the die 102 may be coupled with the package substrate 104 in a flip-chip configuration, as can be seen. In a flip-chip configuration, an active side of the die 102 may be directly coupled with the package substrate 104 using the interconnect structures 106. For example, bond pads 108 on the active side of the die 102 may be coupled with corresponding bond pads 110 on the package substrate 104 using solderable material 112 (e.g., solder bumps) to form an electrically conductive bond between the die 102 and the package substrate 104. In some embodiments, the interconnect structures 106 may be configured to route electrical signals such as, for example, input/output (I/O) signals and/or power to or from the die 102. The solderable material 112 may be configured in an array of bumps in some embodiments.

The package substrate 104 may be configured to electrically couple with another external component (e.g., a circuit board such as motherboard 1002 of FIG. 10) using one or more package interconnect structures (hereinafter "interconnect structures 114"). The interconnect structures 114 may include, for example, bond pads 116 and solder balls 118 configured to route the electrical signals (e.g., I/O and/or power) to or from the package substrate 104. The interconnect structures 114 may be arranged in a ball-grid array (BGA) configuration in some embodiments.

The package substrate 104 may be further configured to electrically couple with another external component (e.g., other dies or substrates) using bond pads 120. The bond pads 120 may be configured to route the electrical signals to or from the package substrate 104. The package substrate 104 may include features such as, for example, traces (not shown) or other form of wiring to route the electrical signals of the die 102 to bond pads 116, 120. In some embodiments, the package substrate 104 may be an interposer.

The interconnect structures 106, 114 and bond pads 120 may be composed of any of a wide variety of electrically conductive materials including metals such as, for example, gold, copper, aluminum, silver, tin, palladium, or nickel. The interconnect structures 106, 114 and bond pads 120 may include other suitable structures or configurations than depicted in other embodiments such as, for example, posts or other well-known structures or configurations.

In some embodiments, an underfill material 122 may be disposed between the die 102 and the package substrate 104. The underfill material 122 may substantially fill a gap between the die 102 and the package substrate 104 and gaps between the interconnect structures 106, as can be seen. The underfill material 122 may provide package stability and reliability of the IC package assembly 100 by reducing a Coefficient of Thermal Expansion (CTE) mismatch between the die 102 and the package substrate 104 and/or interconnect structures 106, and structurally strengthen the IC package assembly 100 by providing adhesive or other structural support. In some embodiments, the underfill material 122 may be composed of a polymer such as, for example, an acrylic-based or epoxy-based material such as resin materials.

Figure 2:
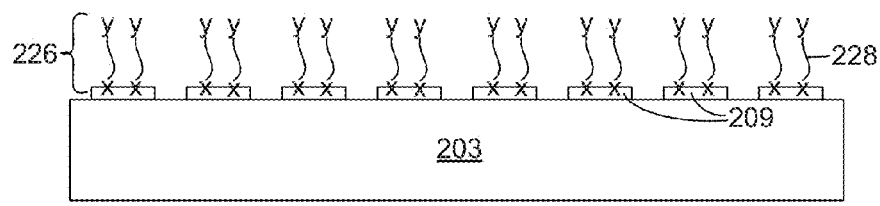
FIG. 2 schematically illustrates an example side view of a protective layer formed on bond pads of an IC substrate, in accordance with some embodiments.
Figure 3:
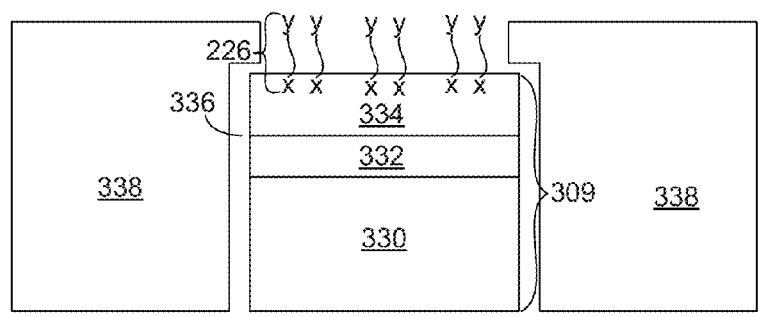
FIG. 3 schematically illustrates an example cross-section side view of a protective layer formed on a bond pad of an IC substrate, in accordance with some embodiments.
Figure 4:
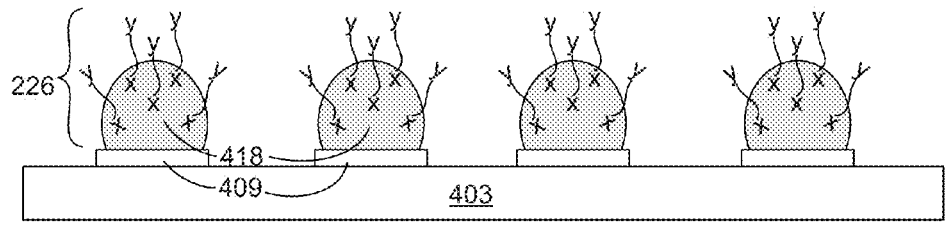
FIG. 4 schematically illustrates an example side view of a protective layer formed on solder balls of an IC substrate, in accordance with some embodiments.

According to various embodiments, a protective layer (e.g., protective layer 226 of FIG. 2) as described further in connection with FIGS. 2-4 may be disposed on a surface of the one or more of the bond pads 108 110, 116, 120, solderable material 112, and/or solder balls 118. The protective layer may be configured to inhibit contamination and/or oxidation of the surface. According to various embodiments, an underfill barrier 124 as described further in connection with FIGS. 5-8 may be disposed on a surface of the package substrate 104. The underfill barrier 124 may be configured to prevent flow of the underfill material 122 outside of an underfill flow area into an area referred to as a Keep Out Zone (KOZ) on the surface of the package substrate 104.

In various embodiments, the die 102 and the package substrate 104 may each be referred to as an "IC substrate." The die 102 may include a substrate composed of a semiconductor material upon which electrical devices such as, for example, transistors and associated circuitry are formed. The package substrate 104 may include a laminate substrate composed of a polymer such as epoxy upon which traces or other circuitry may be formed. The die 102 and the package substrate 104 are not limited to these example materials and may include other suitable well-known materials in other embodiments. Principles described herein are not limited to these examples and may be applied to other types of substrates (e.g., a circuit board) in other embodiments.

FIG. 2 schematically illustrates an example side view of a protective layer 226 formed on bond pads 209 of an IC substrate 203, in accordance with some embodiments. The IC substrate 203 may represent, for example, any of die 102 or package substrate 104 of FIG. 1 and the bond pads 209 may represent any of bond pads 108, 110, 116, 120 of FIG. 1.

According to various embodiments, a protective layer 226 may be formed on the bond pads 209. The protective layer 226 may include, for example a monolayer composed of a first functional group, x, bonded with a metal surface of the bond pads 209 and a second functional group, y, bonded with the first functional group x, as can be seen. The bond between the first functional group x and the metal surface of the bond pads 209 may be a covalent bond in some embodiments. The first functional group x may be composed of an element or organic group (e.g., sulfur or phosphorous) having a lone pair of electrons that is configured to form a coordination bond with metals (e.g., gold, copper, or silver). In some embodiments, the first functional group x may include a sulfur-containing functional group such as a thiol or sulfide and the like or a phosphorous-containing functional group such as phosphate, phosphine or phosphonyl group and the like.

The second functional group y may be bonded with the first functional group y via a carbon chain 228. The carbon chain may include a number of carbon atoms ranging from 10 carbon atoms to 20 carbon atoms in some embodiments. The second functional group y may be composed of an element or organic group that has a lower surface energy characteristic or is hydrophobic to inhibit contamination of the metal surface by hydrophilic or "non-wetting" materials. In some embodiments, the second functional group y may include fluoro groups, silanes, or like materials that provide a highly hydrophobic surface having a surface energy less than 25-28 dyne/centimeter (cm). Non-wetting materials in this example may include materials that prevent or otherwise inhibit solderable material (e.g., solderable material 112 or solder balls 118) from adhering to the bond pads 209. For example, the hydrophilic or non-wetting materials may include underfill material (e.g., underfill material 122 of FIG. 1) such as epoxy or acrylic materials or oxidation that may form on the metal surface. For example, the bond pads 120 of FIG. 1 may have the protective layer 226 to inhibit adherence of any of the underfill material 122 that may bleed over the surface of the package substrate 104 onto the bond pads 120. In some embodiments, the second functional group y comprises trimethylsilyl or fluorine. For example, the second functional group y may include silanes or fluoro groups and the like coupled with a respective carbon chain 228.

In some embodiments, the protective layer 226 may include 12-(trimethylsily)-1-dodecanethiol. For example, the IC substrate 203 may be treated with a solution of less than 5% by volume 12-(trimethylsily)-1-dodecanethiol and greater than 85% by volume ethanol such that a monolayer or cluster of the 12-(trimethylsily)-1-dodecanethiol molecules bond with the metal surface of the bond pads 209. For example, a metal-sulfur coordination bond may be formed between the metal surface of the bond pads 209 and the sulfur (e.g., first functional group x). The trimethylsilyl groups (e.g., second functional group y) may inhibit contamination and/or oxidation.

In some embodiments, the protective layer 226 may serve as an anti-bleed and anti-tarnish barrier without adversely affecting electrical performance of the bond pads 209. Contamination of the bond pads 209 by hydrophilic materials or oxidation may lead to delamination, cracking, or other failure of the bond pads 209. The protective layer 226 may simultaneously protect the metal surface of the bond pads 209 from contamination by hydrophilic materials (e.g., underfill material 122 of FIG. 1 that may bleed onto the bond pads 209) and inhibit oxidation that may form on the metal surface during thermal processing of the IC substrate 203 (e.g., copper oxide) or by Galvanic reaction (e.g., nickel oxide). Although the protective layer 226 is depicted as a monolayer in FIG. 2, the protective layer 226 may include additional layers in other embodiments.

FIG. 3 schematically illustrates an example cross-section side view of a protective layer 226 formed on a bond pad 309 of an IC substrate (e.g., IC substrate 203 of FIG. 2), in accordance with some embodiments. The bond pad 309 may represent one of bond pads 209 of FIG. 2 and comport with embodiments described in connection with FIG. 2.

The bond pad 309 may include multiple layers of different metals in some embodiments. In one embodiment, the bond pad 309 includes a first layer 330 composed of a first metal (e.g., nickel), a second layer 332 composed of a second metal (e.g., palladium), and a third layer 334 composed of a third metal (e.g., gold). The first metal, second metal, and third metal may have different chemical compositions. A solder resist material 338 may be configured as can be seen with an air gap 336 disposed between the layers 330, 332, 334 of the bond pad 309 and the solder resist material 338.

A protective layer 226 may be formed on the third layer 334 to inhibit contamination and oxidation. For example, the protective layer 226 may inhibit the formation of oxidation formed by the first metal or second metal of the respective first layer 330 and second layer 332 on a surface of the third layer 334 by Galvanic reaction. During assembly processes, moisture may be disposed in the air gap 336 and allow diffusion of the first metal of the first layer 330 or second metal of the second layer 332 to a surface of the third metal of the third metal layer 334 where the first or second metal may combine with oxygen from ambient air to form an oxide (e.g., nickel oxide). The protective layer 226 may inhibit or prevent the formation of oxide by Galvanic reaction. The protective layer 226 may further inhibit or prevent the formation of metal-oxide associated with thermal processes. For example, the protective layer 226 may be deposited on a copper metal surface of the bond pad 309 to inhibit or prevent the formation of copper oxide by protecting the bond pad 309 from water and oxygen. The bond pad 309 may include more or fewer layers than depicted in other embodiments.

FIG. 4 schematically illustrates an example side view of a protective layer 226 formed on solder balls 418 of an IC substrate 403, in accordance with some embodiments. The solder balls 418 may comport with embodiments described in connection with solder balls 118 of FIG. 1. The solder balls 418 may be disposed on bond pads 409, which may comport with embodiments described in connection with bond pads 209 of FIG. 2 or bond pads 116 of FIG. 1.

The protective layer 226 may inhibit contamination of the solder balls 418 by non-wetting materials as described in connection with FIG. 2 for the bond pads 209. In some embodiments, the solder balls 418 are composed of tin. The solder balls 418 may include other suitable materials in other embodiments. In some embodiments, the protective layer 226 may be formed on solderable material 112 of FIG. 1 according to principles described herein.

Techniques and configurations described in connection with FIG. 4 may be combined with techniques and configurations described in connection with FIGS. 2-3. For example, the bond pads 409 may be treated to form a protective layer 226 on the bond pads 409 and the solder balls 418 may also be treated to form a protective layer 226 on the solder balls 418 in some embodiments.

Figure 5:
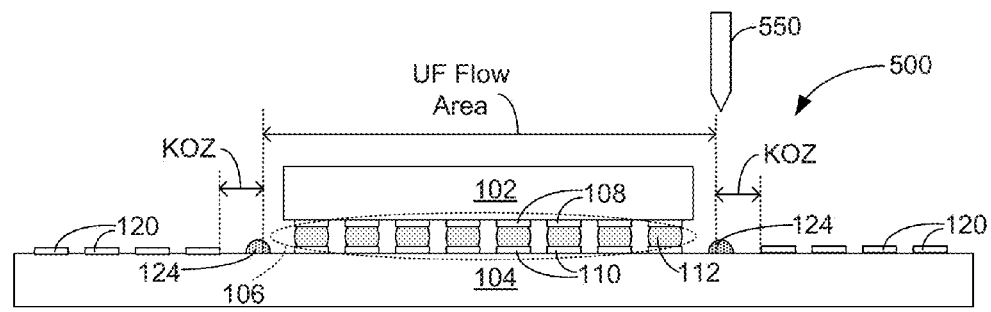
FIG. 5 schematically illustrates an example side view of an IC package assembly subsequent to forming an underfill barrier on a package substrate, in accordance with some embodiments.
Figure 6:
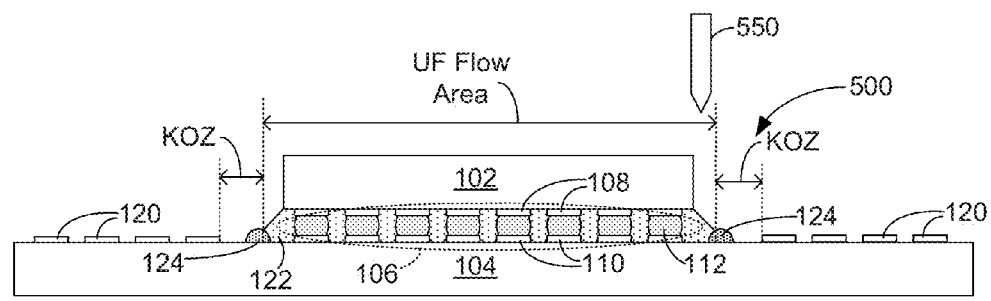
FIG. 6 schematically illustrates an example side view of an IC package assembly subsequent to depositing an underfill material between a die and the package substrate, in accordance with some embodiments.
Figure 7:
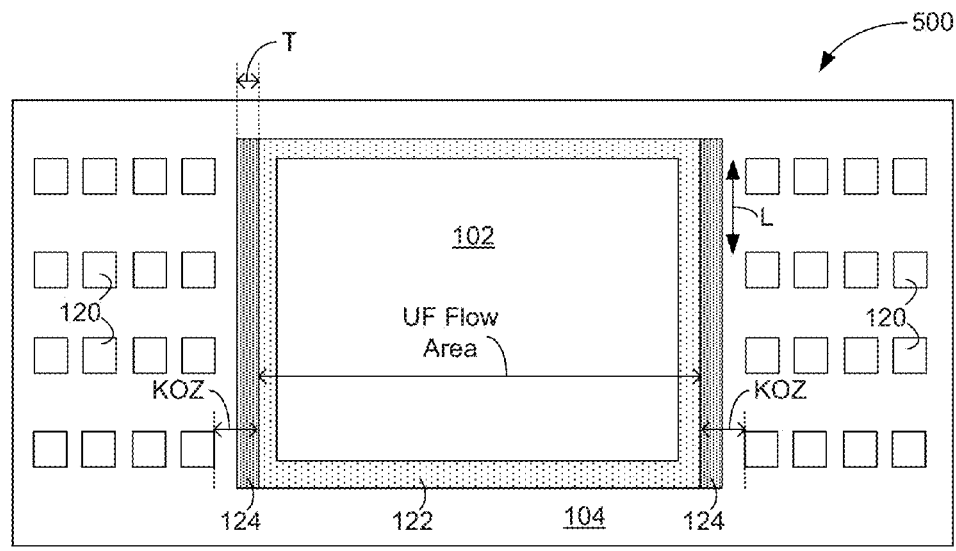
FIG. 7 schematically illustrates an example top view of an IC package assembly subsequent to depositing an underfill material between a die and a package substrate, in accordance with some embodiments.

FIG. 5 schematically illustrates an example side view of an IC package assembly 500 subsequent to forming an underfill barrier 124 on a package substrate 104, in accordance with some embodiments. FIG. 6 schematically illustrates an example side view of an IC package assembly 500 subsequent to depositing an underfill material 122 between a die 102 and the package substrate 104, in accordance with some embodiments. FIG. 7 schematically illustrates an example top view of an IC package assembly 500 subsequent to depositing an underfill material 122 between a die 102 and the package substrate 104, in accordance with some embodiments.

Referring to FIGS. 5-7, the underfill barrier 124 may be disposed on a surface of the package substrate 104, as can be seen, to prevent flow of an underfill material 122 outside of an underfill flow area (UF Flow Area) on a surface of the package substrate 104. For example, the underfill barrier 124 may be formed on solder resist material of the package substrate 104. The underfill barrier 124 may further be formed on other materials on the surface of the package substrate 104 such as, for example, metal traces (not shown) or unused bond pads.

The underfill flow area may be a region on the package substrate 104 designated for the deposition of underfill material 122. The underfill barrier 124 may be formed at a terminating boundary of the underfill flow area and a Keep Out Zone (KOZ) to prevent the underfill material 122 from flowing into the KOZ. The KOZ may be an area on the package substrate 104 where underfill material 122 is not desired (e.g., to prevent flow of the underfill material 122 beyond the KOZ). The KOZ may provide a buffer zone to avoid bleeding of underfill material 122 onto components (e.g., a region adjacent to or near bond pads 120). Using the underfill barrier 124 may allow design and fabrication of the KOZ to smaller dimensions to accommodate scaling of components of the IC package assembly 500 to smaller dimensions. In some embodiments, the underfill material 122 is in direct contact with the underfill barrier 124.

The underfill barrier 124 may be composed of a polymer such as, for example, an epoxy or acrylic material that is deposited by a jet dispense process (e.g., nozzle 550 of FIG. 5). The underfill barrier 124 may provide a barrier to prevent flow of a wide range of underfill materials by physical and/or chemical means. In some embodiments, the underfill barrier 124 may be a linear structure having a lengthwise dimension (in the direction of arrow L of FIG. 7) that is substantially parallel with a terminating edge of the die 102, as can be seen in FIG. 7. The underfill barrier 124 may have a thickness, T, that is less than the lengthwise dimension of the underfill barrier 124. In some embodiments, the thickness T is less than 200 microns.

Although the underfill barrier 124 depicted in FIG. 7 includes two linear structures, the underfill barrier 124 may include more or fewer linear structures than depicted in other embodiments. The underfill barrier 124 may surround the underfill flow area and/or the die 102 in some embodiments to prevent flow of the underfill material 122 in other directions.

In one embodiment, the underfill barrier 124 may be composed of a nanocomposite epoxy material having a high thixotropic index. Deposition of the underfill barrier 124 having the high thixotropic index may be followed by dispense of the underfill material 122 using a jet dispense process (e.g., nozzle 550 of FIG. 6). In some embodiments, the underfill material 122 and material of the underfill barrier 124 may be simultaneously cured (e.g., during a same process operation in same fabrication equipment).

In some embodiments, a thixotropic index of material of the underfill barrier 124 may range from 3 to 5 or be greater in other embodiments. A material may have a high thixotropic index when viscosity of the material decreases nonlinearly with increasing shear rate. A material may have a low thixotropic index when viscosity of the material increases linearly with increasing shear rate. A high thixotropic index may be achieved in the underfill barrier 124, for example, by including surface functionalized particles such as micron-filler and/or nano-filler additives in the underfill barrier 124. The surface functionalized particles may include, for example, micron- and/or nano-sized silica having surface functionalization such as, for example zinc oxide or titania.

The addition of surface functionalized particles may increase thixotropy of material of the underfill barrier 124, which may increase an aspect ratio (height vs. spread) and decrease spread of the underfill barrier 124 material upon dispense. The thixotropy, aspect ratio, and spread of the underfill barrier 124 material can be controlled by controlling the surface functionalities of the surface functionalized particles. For example, silica particles may have hydroxyl groups on the surface to which other chemical moieties can be attached to provide high thixotropy. The chemical moieties can include, for example, various silane groups such as epoxy silanes, alkyl silanes, and the like, that can weakly bond various surface functionalized particles together and thus increase thixotropy of the resulting material.

In some embodiments, the underfill barrier 124 composed of a nanocomposite epoxy material and having a high thixotropic index may have a low spread ranging from 0.1 millimeters (mm) to 0.2 mm, a height relative to the surface of the package substrate 104 that does not exceed a height of a surface of the die 102 that is farthest from the surface of the package substrate (e.g., height less than 200 microns), and/or high contact angles (e.g., contact angles ranging from 70° to 90°) with the surface of the package substrate 104. In some embodiments the underfill barrier 124 material may further include non-wetting agents that cause the underfill barrier 124 to chemically repel the underfill material 122. For example, the surface functionalized particles may further include surface functionality including fluorine (e.g., fluoride) or silanes attached to aliphatic chains to provide an underfill barrier 124 with non-wetting characteristics.

Figure 8:
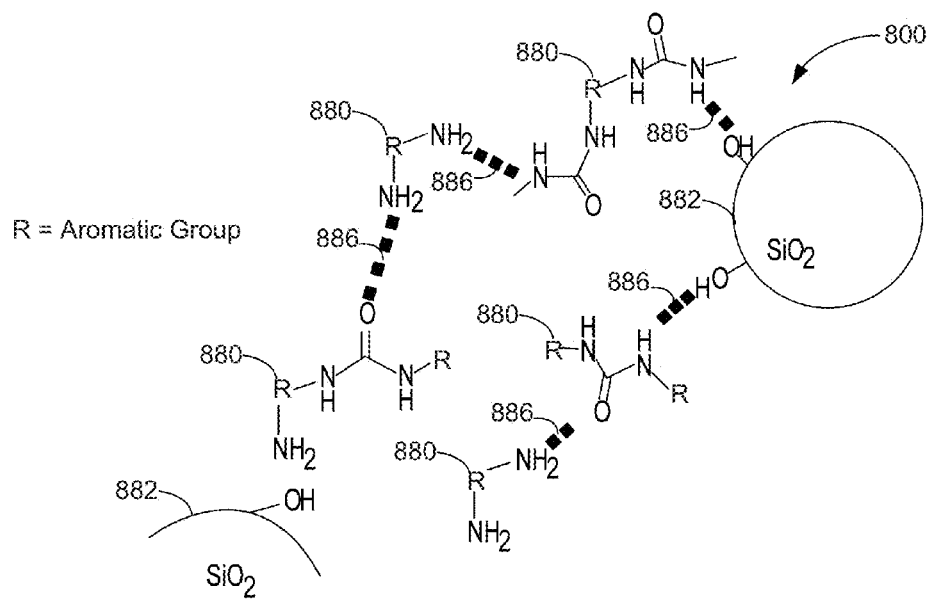
FIG. 8 schematically illustrates an underfill barrier formulation including thixotrogen, in accordance with some embodiments.

Referring briefly to FIG. 8, an underfill barrier formulation 800 including thixotrogen 880 is schematically illustrated, in accordance with some embodiments. The thixotrogen 880 may be a binding agent or particle cross-linking agent that alters surface chemistry of the nanocomposite material in the underfill barrier 124 and can impart a high thixotropic property to the underfill barrier material. The thixotrogen 880 may include aromatic diamines or like functional group, which may be coupled with amidic groups to provide cross-linking with each other and with silica particles, facilitated by hydrogen bonds 886. For example, thixotrogen 880 may be added to a well-dispersed mixture of surface functionalized particles such as silica 882 (e.g., $SiO_2$) in epoxy resin and react with surface groups (e.g., hydroxyl groups) of the surface functionalized particles to bind the surface functionalized particles together. The thixotrogen 880 may include functional groups that form hydrogen bonds 886 with functional groups of the surface functionalized particles (e.g., silica 882) and/or the epoxy resin, as can be seen. In some embodiments, the thixotrogen 880 may be composed of an amine-based epoxy curing agent, which may be lightly cross-linked with an isocyanate (e.g., NCO type of compound). The thixotrogen 880 may be added in a ratio with the epoxy that does not result in excessive cross-linking or early cure.

A hardener and/or catalyst may also be added to the underfill barrier formulation 800 to facilitate the reaction. Such underfill barrier formulation 800 may provide a high thixotropy characteristic of the underfill barrier 124 material that allows dispense of the underfill barrier 124 material under shear force and also possess a high aspect ratio post-dispense.

Returning again to FIGS. 5-7, in another embodiment, the underfill barrier 124 may be composed of an epoxy- or acrylic-based resin that can be cured thermally or by ultraviolet (UV) light to provide a low surface energy (e.g., less than 25 dyne/cm) of the underfill barrier 124. For example, the underfill barrier 124 may be formed by depositing underfill barrier 124 material by a jet dispense process (e.g., nozzle 550 of FIG. 5) and curing the deposited underfill barrier 124 material prior to depositing underfill material 122 by a jet dispense process (e.g., nozzle 550 of FIG. 6). The low surface energy of the underfill barrier 124 material may provide the underfill barrier 124 with non-wetting characteristics relative to uncured underfill material 122 and, thus, inhibit or prevent flow of the underfill material 122. The deposited underfill material 122 may have a high surface tension such that when the underfill material 122 flows and comes near or in contact with the underfill barrier 124, the underfill material 122 may be repelled owing to large surface energy differences between the underfill barrier 124 and the underfill material 122. In some embodiments, a surface energy difference between underfill material 122 and underfill barrier 124 material is equal to or greater than 15 dyne/cm. In some embodiments, the underfill material 122 may have a surface tension ranging from 35 millinewtons (mN)/meter (m) to 45 mN/m at 25° C. and having a coefficient of thermal expansion (CTE) ranging from 26 parts per million (ppm)/° C. to 32 ppm/° C.

In some embodiments, the underfill barrier 124 material may be deposited by dispense equipment having in situ UV curing lamps to cure the deposited underfill barrier 124 material. Subsequently, the underfill material 122 may be deposited in the dispense equipment without removing the package substrate 104 from the dispense equipment.

In some embodiments, the underfill barrier 124 material may include a photoinitiator that facilitates cross-linking reactions of the underfill barrier 124 material in the presence of UV light. In some embodiments, the underfill barrier 124 material may further include hardener or filler to facilitate cross-linking by thermal curing process. Viscosity of the underfill barrier 124 material may be varied by changing a ratio of high molecular weight and low molecular weight resin. The resin may be configured with surface functionality to facilitate adhesion of the underfill barrier 124 material on a solder resist surface of the package substrate 104.

In some embodiments, the underfill barrier 124 material may be composed of a printed circuit board (PCB) marking ink or similar material that has low surface energy (e.g., between 15-18 dyne/centimeter). In some embodiments, the underfill barrier 124 material may have a surface energy less than or equal to 18 dyne/centimeter, a height relative to the surface of the package substrate 104 that is less than 20 microns in a direction that is perpendicular to a plane formed by the surface of the package substrate 104, and a thickness T that is less than or equal to 150 microns. In some embodiments, using a technique that cures the underfill barrier 124 material prior to depositing the underfill material 122 as described herein may allow the formation of an underfill barrier 124 having a smaller thickness T than a technique that simultaneously curse the underfill barrier 124 material and the underfill material 122 (e.g., using a nanocomposite underfill barrier 124 material having a high thixotropic index).

In some embodiments, low surface energy components such as, for example, micro- or nano-silica filler functionalized with a fluorine-containing material such as fluoride may be added to the underfill barrier 124 material to increase a surface energy difference between the underfill barrier 124 material and the underfill material 122 and provide increased control of flow of the underfill material 122. The low surface energy components may come to a surface of a cured underfill barrier 124 material to make a surface of the underfill barrier 124 highly hydrophobic in nature.

Figure 9:
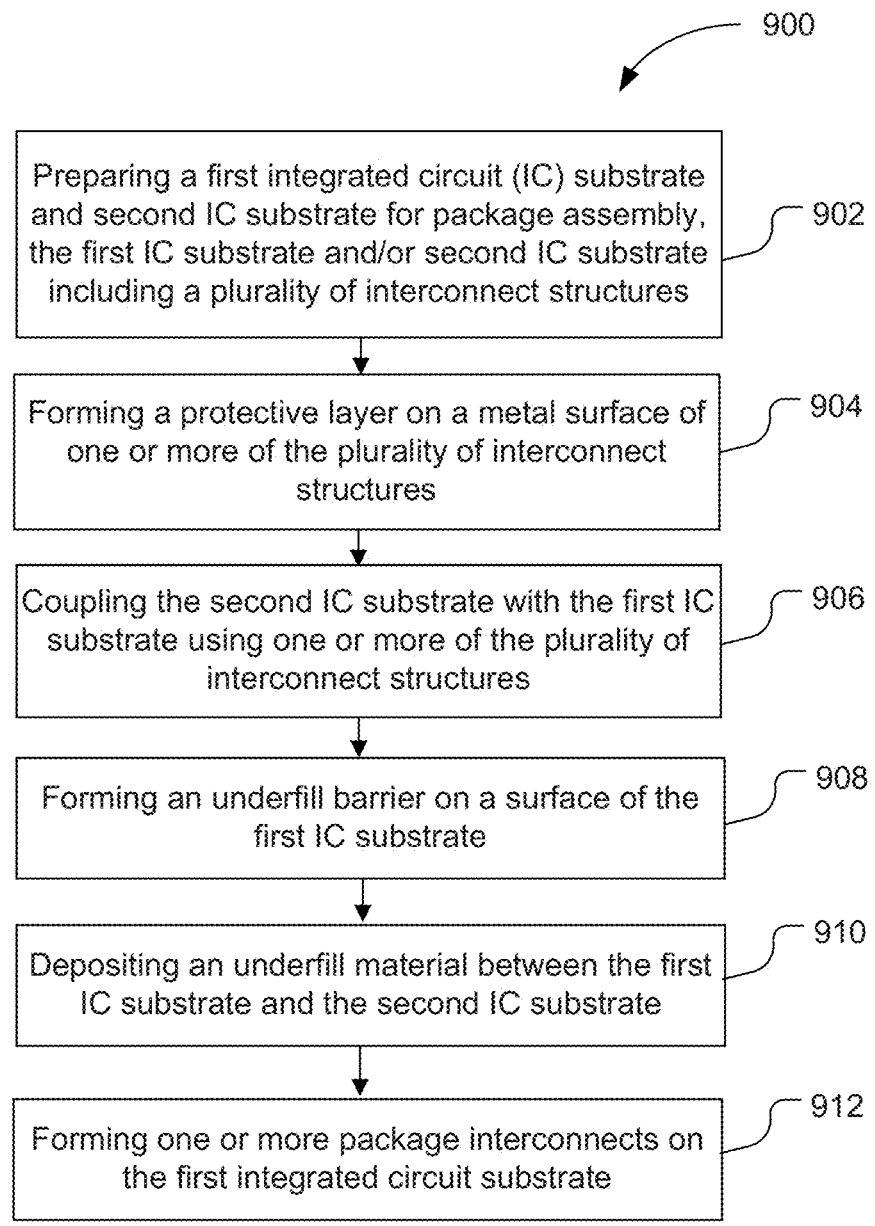
FIG. 9 is a flow diagram for a method of fabricating an IC package assembly, in accordance with some embodiments.

FIG. 9 is a flow diagram for a method 900 of fabricating an IC package assembly (e.g., IC package assembly 100 of FIG. 1), in accordance with some embodiments. The method 900 may comport with embodiments described in connection with FIGS. 1-8.

At 902, the method 900 includes preparing a first integrated circuit (IC) substrate (e.g., package substrate 104 of FIG. 1) and second IC substrate (e.g., die 102 of FIG. 1) for package assembly, the first IC substrate and/or second IC substrate including a plurality of interconnect structures (e.g., interconnect structures 106, 114 or bond pads 120 of FIG. 1). Preparation may include forming the plurality of interconnect structures on the first IC substrate and/or second IC substrate. For example, the IC substrate may be a package substrate and the second IC substrate may be a die. The die may be prepared for package assembly by singulation processes (e.g., die-cutting by saw or laser) to provide a discrete die from a wafer having multiple dies, thinning of the die, and/or coating of the die to protect the die from equipment handling associated with package assembly.

One or more of the plurality of interconnect structures formed on the first IC substrate and/or second IC substrate may be cleaned in preparation for forming a protective layer on a metal surface of the one or more interconnect structures. The cleaning may be performed in a chip-attach-module (CAM) configured to clean surfaces of the plurality of interconnect structures using flux materials. In some embodiments, an acid and alkali cleaning is performed on the metal surface of the one or more interconnect structures to remove any oil contamination. Any oxide on the metal surface may be removed by deoxidizing the metal surface using sulfuric acid (e.g., 5% by volume $H_2SO_4$ at 25° C. for about 10 seconds).

At 904, the method 900 may further include forming a protective layer (e.g., protective layer 226 of FIGS. 2-4) on a metal surface of the one or more interconnect structures. The protective layer may be formed, for example, by dipping, spraying, or using any other suitable deposition process to apply a solution having materials of the protective layer (e.g., a solution having less than 5% by volume 12-(trimethylsily)-1-dodecanethiol and greater than 85% by volume ethanol) on the one or more interconnect structures. In some embodiments, CAM flux dispense equipment is used to apply the solution.

In some embodiments, a rinsing process may remove any excess solution. For example, the rinsing process may include rinsing with deionized (DI) water (e.g., at 25° C. for about 5 seconds). In embodiments where the solution is selectively sprayed on the interconnect structures, a rinsing process may not be used.

At 906, the method 900 may further include coupling the second IC substrate with the first IC substrate using one or more of the plurality of interconnect structures. In some embodiments, solder joints are formed between the first IC substrate and the second IC substrate by reflowing solderable material (e.g., solderable material 112 of FIG. 1) disposed on bond pads (e.g., bond pads 108, 110 of FIG. 1). A solder reflow process may be a thermal process using temperatures greater than 200° C. (e.g., 340° C. to 360° C.) to soften the solderable material for bonding. In some embodiments, the protective layer may inhibit or prevent oxidation of the metal surface of treated interconnect structures during the thermal process. A deflux process may be used to clean residue of the solder reflow process.

At 908, the method 900 may further include forming an underfill barrier (e.g., underfill barrier 124 of FIG. 1 or FIGS. 5-8) on a surface of the first IC substrate. The underfill barrier may be formed by depositing a material including an epoxy or acrylic material on the surface of the first IC substrate. The underfill barrier may be deposited, for example, using a jet dispense process (e.g., inkjet). In some embodiments, the underfill barrier material may be deposited to provide an underfill barrier having a linear structure with a lengthwise dimension that is substantially parallel with a terminating edge of the second integrated circuit when the second integrated circuit is coupled with the first integrated circuit.

In some embodiments, the underfill barrier material may not be cured prior to depositing an underfill material (e.g., underfill material 122 of FIG. 1) between the first IC substrate and the second IC substrate at 910. For example, the underfill barrier material and the underfill material deposited at 910 may be simultaneously cured in a same fabrication equipment using a same thermal process. In other embodiments, the underfill barrier material may be cured prior to depositing the underfill material at 910. The underfill barrier material may be cured, for example, by UV light prior to depositing the underfill material at 910.

At 910, the method 900 may further include depositing an underfill material between the first IC substrate and the second IC substrate. The underfill material may be deposited by a jet dispense process. Capillary action of the underfill material may cause the underfill material to spread between the first IC substrate and second IC substrate. The underfill barrier may prevent flow of the underfill material outside of the underfill flow area (e.g., prevent underfill from flowing into the KOZ) on the surface of the first IC substrate prior to curing the underfill material. Forming a protective layer at 904 prior to forming an underfill barrier at 908 or depositing an underfill material at 910 may advantageously protect the interconnect structures having the protective layer from contamination by the underfill barrier material or the underfill material. Forming a protective layer at 904 prior to coupling at 906 may advantageously protect the interconnect structures having the protective layer from oxidation that may occur during thermal processes associated with coupling at 906.

At 912, the method may further include forming one or more package interconnects on the first integrated circuit substrate. The package interconnects may include, for example, solder balls (e.g., solder balls 118 of FIG. 1) to facilitate coupling of the IC package assembly with another external component. The IC package assembly may be encapsulated with a mold compound and marked with laser markings to identify a product embodied in the IC package assembly in some embodiments.

In some embodiments, actions at 904 and 908 are both performed. In other embodiments, actions at one of 904 or 908 may not be performed at all. Various operations are described as multiple discrete operations in turn, in a manner that is most helpful in understanding the claimed subject matter. However, the order of description should not be construed as to imply that these operations are necessarily order dependent. For example, in some embodiments, the package interconnects formed at 912 may be treated to form a protective layer as described in connection with actions at 904. In some embodiments, actions at 908 may be performed any suitable time prior to depositing the underfill material at 910.

Figure 10:
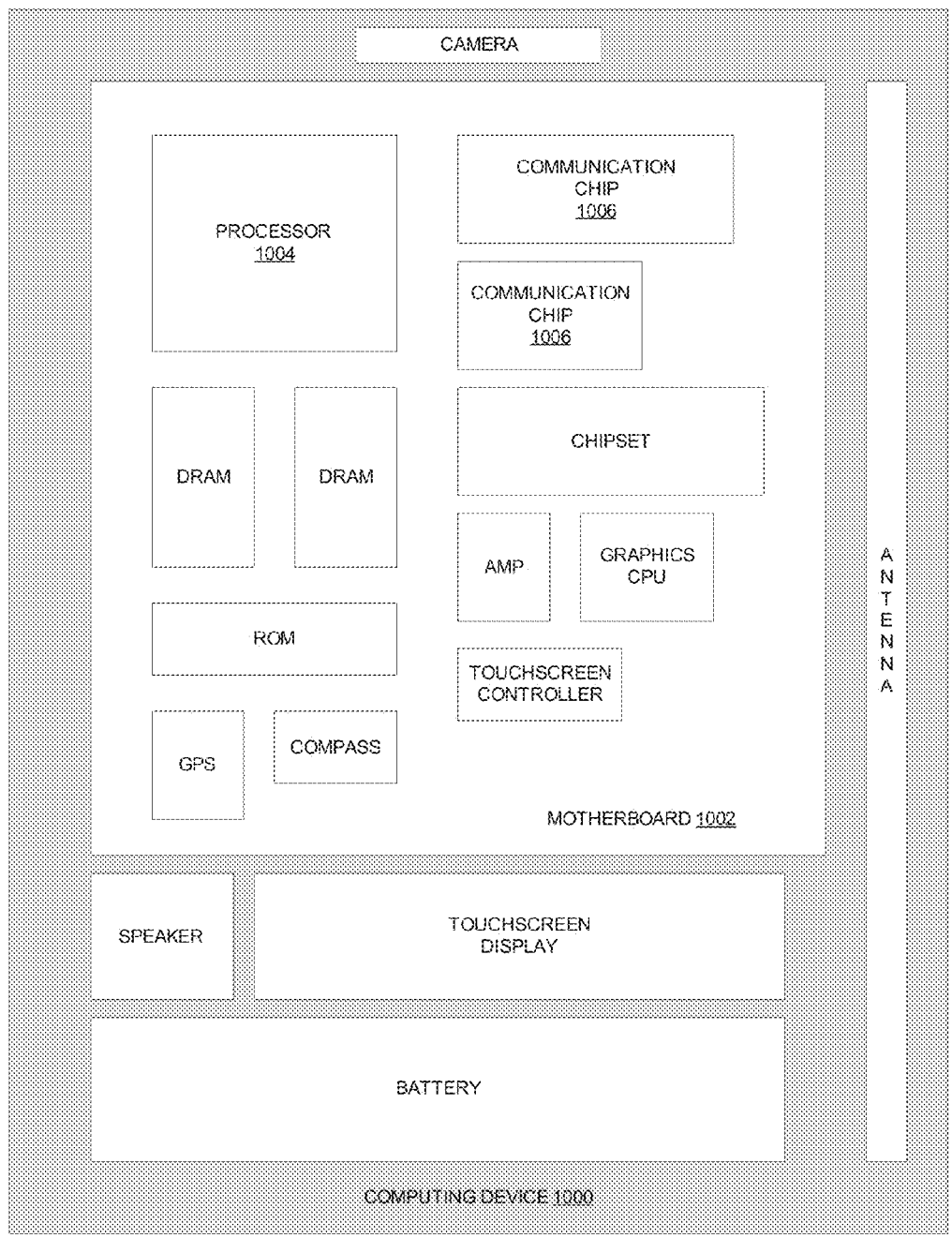
FIG. 10 schematically illustrates a computing device in accordance with one implementation of the invention.

Embodiments of the present disclosure may be implemented into a system using any suitable hardware and/or software to configure as desired. FIG. 10 schematically illustrates a computing device 1000 in accordance with one implementation of the invention. The computing device 1000 may house a board such as motherboard 1002. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 may include a die (e.g., die 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 1006 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 1000 may contain a die (e.g., die 102 of FIG. 1) in an IC package assembly (e.g., IC package assembly 100 of FIG. 1) as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
an integrated circuit substrate;
a bond pad disposed on the integrated circuit substrate, the bond pad being configured to route electrical signals to or from the integrated circuit substrate and comprising a metal surface; and
a protective layer disposed on the metal surface of the bond pad, the protective layer comprising a first functional group bonded with the metal surface and a second functional group bonded with the first functional group, wherein the second functional group is hydrophobic to inhibit contamination of the metal surface by hydrophilic materials and further inhibits oxidation of the metal surface and wherein the protective layer comprises 12-(trimethylsilyl)-1-dodecanethiol.

2. The apparatus of claim 1, wherein:
the protective layer is a monolayer.

3. The apparatus of claim 1, wherein the metal surface comprises gold, copper, silver, tin, palladium, or nickel.

4. The apparatus of claim 1, further comprising:
an underfill barrier disposed on a surface of the integrated circuit substrate, the underfill barrier comprising an epoxy or acrylic material and being configured to prevent flow of an underfill material outside of an underfill flow area, wherein the second functional group inhibits contamination of the metal surface by the underfill material.

5. The apparatus of claim 1, wherein the integrated circuit substrate comprises a die, an interposer, or a package substrate.

6. A method, comprising:
forming a bond pad on an integrated circuit substrate, the bond pad being configured to route electrical signals to or from the integrated circuit substrate and comprising a metal surface;
forming a protective layer on the metal surface of the bond pad, the protective layer comprising a first functional group bonded with the metal surface and a second functional group bonded with the first functional group, wherein the second functional group inhibits contamination of the metal surface by hydrophilic materials and further inhibits oxidation of the metal surface, wherein forming the protective layer comprises applying a solution to the metal surface, the solution comprising greater than 85% ethanol by volume and less than 5% 12-(trimethylsilyl)-1-dodecanethiol by volume; and
performing a thermal process on the integrated circuit substrate at a temperature greater than 200° C., wherein the protective layer inhibits oxidation of the metal surface during the thermal process.

7. The method of claim 6, wherein the metal surface comprises gold, copper, silver, tin, palladium, or nickel.

8. The method of claim 6, wherein applying the solution to the metal surface comprises dipping the metal surface into the solution or spraying the metal surface with the solution.

9. The method of claim 6, wherein forming the protective layer further comprises:
rinsing the metal surface with deionized water.

10. The method of claim 6, wherein the integrated circuit substrate is a first integrated circuit substrate, the method further comprising:
coupling a second integrated circuit substrate with the first integrated circuit substrate using the interconnect structure; and
depositing an underfill material between the first integrated circuit substrate and the second integrated circuit substrate, wherein the protective layer inhibits contamination of the metal surface by the underfill material.

* * * * *